United States Patent
Duffy et al.

(10) Patent No.: US 7,002,249 B2
(45) Date of Patent: Feb. 21, 2006

(54) MICROELECTRONIC COMPONENT WITH REDUCED PARASITIC INDUCTANCE AND METHOD OF FABRICATING

(75) Inventors: Thomas P. Duffy, Chandler, AZ (US); John Ryan Goodfellow, Mesa, AZ (US); Robert T. Carroll, Andover, MA (US); Kevin J. Cote, Ocotillo, AZ (US); Sampath K. V. Karikalan, Phoenix, AZ (US); Suresh Golwalkar, Phoenix, AZ (US)

(73) Assignee: Primarion, Inc., Phoenix, AZ (US)

( * ) Notice: Subject to any disclaimer, the term of this patent is extended or adjusted under 35 U.S.C. 154(b) by 0 days.

(21) Appl. No.: 10/294,423

(22) Filed: Nov. 12, 2002

(65) Prior Publication Data

US 2004/0104456 A1    Jun. 3, 2004

(51) Int. Cl.
*H01L 23/495* (2006.01)
*H01L 27/02* (2006.01)
*H01L 23/48* (2006.01)

(52) U.S. Cl. ............ 257/728; 257/532; 257/676; 257/916; 257/724; 257/659; 257/698; 257/696; 257/784; 257/666; 257/668; 257/692; 257/691; 257/786; 174/52.4; 361/813

(58) Field of Classification Search ........... 257/666, 257/532, 676, 916, 724, 728, 659, 698, 696, 257/786, 784, 668, 692, 672, 787, 712, 691, 257/690, 475; 174/52.4; 29/827; 361/813
See application file for complete search history.

(56) References Cited

U.S. PATENT DOCUMENTS

| | | | | |
|---|---|---|---|---|
| 3,996,603 | A * | 12/1976 | Smith ................... | 257/668 |
| 4,146,697 | A * | 3/1979 | White ................... | 526/194 |
| 5,162,896 | A * | 11/1992 | Takubo et al. .......... | 257/664 |
| 5,801,450 | A * | 9/1998 | Barrow ................. | 257/784 |
| 5,869,898 | A * | 2/1999 | Sato .................... | 257/728 |
| 5,880,531 | A * | 3/1999 | Hagiya et al. .......... | 257/786 |
| 6,008,532 | A * | 12/1999 | Carichner .............. | 257/691 |
| 6,177,834 | B1 * | 1/2001 | Blair et al. ............ | 327/566 |
| 6,365,918 | B1 * | 4/2002 | Litwin et al. .......... | 257/777 |
| 6,504,236 | B1 * | 1/2003 | Bissey ................. | 257/666 |
| 6,538,336 | B1 * | 3/2003 | Secker et al. .......... | 257/786 |
| 6,567,299 | B1 * | 5/2003 | Kunikiyo et al. ........ | 365/173 |
| 2004/0227547 | A1 * | 11/2004 | Shiraishi et al. ........ | 327/110 |

* cited by examiner

*Primary Examiner*—Alexander Oscar Williams
(74) *Attorney, Agent, or Firm*—T. E. Galanthay

(57) ABSTRACT

A semiconductor device package is disclosed which includes inter-digitated input and output bond wires configured to increase the negative mutual inductive coupling between the wires, thus reducing the overall parasitic inductance of the device. In one embodiment, the microelectronic component includes a semiconductor device coupled to a substrate, such as a lead frame, a first set of bond wires connected to the semiconductor device for providing current flow into the semiconductor device, and a second set of bond wires that are in a current loop with the first set of bond wires and are connected to the semiconductor device for providing current flow out of the semiconductor device, wherein the first and second set of bond wires are configured in an inter-digitated pattern to increase the magnitude of mutual inductive coupling between the first and second set of bond wires. In one embodiment, the semiconductor device comprises a single semiconductor chip and the lead frame comprises a Quad Flat No-Lead (QFN) lead frame. Other embodiments include multiple chips and/or multiple lead frames.

14 Claims, 8 Drawing Sheets

MICROELECTRONIC COMPONENT WITH REDUCED PARASITIC INDUCTANCE AND METHOD OF FABRICATING

CROSS-REFERENCE TO RELATED PATENT APPLICATIONS

U.S. patent application Ser. No. 10/237,903, filed on Sep. 9, 2002, by Thomas P. Duffy, Malay Trivedi, and Kevin Mori, entitled: SYSTEM AND METHOD FOR CURRENT HANDLING IN A DIGITALLY-CONTROLLED POWER CONVERTER, now U.S. Pat. No. 6,795,009.

BACKGROUND OF THE INVENTION

1. Technical Field

The present invention relates, generally, to the packaging of semiconductor chips and, more particularly, to wire bond techniques effective in reducing parasitic inductance in microelectronic components, i.e. packaged semiconductor chips.

2. Background Information

Recent advances in the design and fabrication of semiconductor devices has dramatically increased their speed and density but has, at the same time, led to significant challenges in the field of semiconductor packaging. These challenges are particularly acute with respect to minimizing the parasitic resistance, inductance, and capacitance (RLC) effects introduced by the various interconnect elements e.g., the leads, paddles and bond wires.

More particularly, in power integrated circuits (ICs) such as voltage regulators and the like, parasitic effects can be performance-limiting factors. During turn-off of a switching device, leakage currents flow in the parasitic loop formed by the capacitance of the switching device with the bulk capacitors at the input. The package parasitic inductance in this loop sets up an oscillation, causing ringing-voltage across the switching device. The overshoot amplitude of the ringing voltage is directly proportional to the total package parasitic inductance of the loop and the current turn-off rate. If the loop inductance is sufficiently high, the overshoot amplitude may reach dangerously high levels and permanently damage the switching device itself.

Moreover, as package parasitics increase, device efficiency decreases. This drives higher power dissipation in the device, forcing it to operate at higher temperatures and leading to early device failure. Therefore, there is a need in the microelectronic component art to achieve a low parasitic package to improve device efficiency.

The total loop inductance in a current path is the sum of the partial self-inductances of each element in that path and the mutual inductances between them. For two inductors in series, for example, the total inductance L is given by:

$$L = L_1 + L_2 \pm 2M$$

where $L_1$ and $L_2$ are the partial self-inductances of the individual inductors and M is the mutual inductance between them. For n wires, total parasitic inductance is n times L plus or minus n times M.

The sign of M will depend on the direction of current flow in the inductors; that is, current flow in the same direction results in a positive M, and current flow in the opposite direction results in a negative M. Thus, when the inward and outward current paths in a current loop are brought closer to each other, the negative mutual inductance between them increases and the overall loop inductance reduces. However, existing microelectronic components have not provided a substantial negative mutual inductance.

For example, FIG. 1 shows a circuit schematic of a typical DC voltage regulator IC 102 which includes a P-type power MOSFET (PFET die 104) and one or more N-type power MOSFETs (nFET dice 106) in the buck-regulator configuration. All these dice 104 and 106 may exist in individual integrated circuit (IC) packages or may be co-packaged together in a multi-chip package as a single component. When high-side pFET switch 104 is turned off by, for example, a pulse width modulation (PWM) control input at its gate, the off-state high voltage that appears across PFET 104 sets up a leakage current in loop 114 as shown. In case of co-packaged dice in a multi-chip package, the total inductance of loop 114 is predominantly made up of package parasitic inductances 108($L_1$), 112($L_2$), and 110($L_3$), and the equivalent series inductance (ESL) of the input capacitors 116 and the mutual inductances between them. At the package level housing for example pFET 104), it is then important to reduce the partial self-inductance values of 108($L_{1)},$ $_{and\ 112(L^2)}$), and/or increase the mutual coupling between the wires that carry current in opposite directions. The first of the two wires carries the Vcc current and contains parasitic inductor 108 and has a resistance of R1. The second wire carries the Vsw current and contains parasitic inductor 112 and has a resistance of R2. The third wire connects nFET 106 to ground and contains parasitic inductor 110 and resistance R3. In case of individually packaged dice 104 and 106, the inductances 108, 112 and 110 and resistances R1, R2 and R3 will be significantly higher that their multi-chip package values due to significant contributions from board level interconnect that provide electrical connections between these devices. The output of the buck converter 102 is provided to the load via output inductor 118 and capacitor 120.

FIG. 2 shows a typical prior art Quad Flat no-Lead (QFN) lead frame used in conjunction with a DC regulator IC such as the one discussed above. The input $V_{cc}$ to PFET die 201 is through a set of bond wires 202, and the $V_{sw}$ current exiting pFET die 201 is carried through a second set of bond wires 203 that are down-bonded to $V_{sw}$ paddle 204. General logic bond wires 205 are typically brought out at the ends of the die, and their respective bond pads 206 are located near the edges of the die, on all sides, to reduce wire length.

Prior art packages such as the one illustrated in FIG. 2 become increasingly unsatisfactory in a number of respects, especially as switching speed increases. In high switching speed applications, for example, the inductance of the wires becomes prohibitively high, causing ringing. While this ringing effect can be minimized by shortening the bond wires and/or adding additional wires in parallel, a point of diminishing returns is quickly reached. This is due to the lower bound on the mutual inductive coupling that could be achieved between the forward and return current paths that is dictated by the spatial separation of the respective bond pads and bond wires for those currents.

The aforementioned wire bond configuration is also unsatisfactory in that the wire bond pads 206 are typically positioned near the outside edges of the die. This provides the shortest wire lengths, but still adds substantial RLC parasitics to the overall circuit due to the need for the current to travel laterally across the die surface. Additional bond pads 206 could be placed in the inner regions of the die surface to alleviate this latter problem, but then the increased wire length will result in increased inductance.

Another prior art method used to reduce inductance is to utilize flip-chip interconnects instead of wire bonds. While this interconnect method can improve performance, it also significantly increases the packaging costs.

The aforementioned failings of the prior art have remained unresolved in a multi-chip package, i.e. a package that houses more than one chip. Achieving loop inductance reduction may hit a roadblock, particularly in low cost wire-bonded lead frame multi-chip packages. The wire bonding process requires that there be a sufficient spatial separation between the individual chips, thus setting a lower bound on the loop inductance reduction that can be achieved by known techniques.

Methods and structures are therefore needed in order to overcome these and other limitations of the prior art.

BRIEF SUMMARY OF THE INVENTION

Structures and methods in accordance with the present invention overcome the failings of the prior art by providing a packaged semiconductor chip with inter-digitated input and output bond wires configured to increase the negative mutual inductive coupling between the wires, thus reducing the overall parasitic inductance of the device.

In accordance with one embodiment of the present invention, a microelectronic component with reduced parasitic inductance includes a semiconductor chip coupled to a substrate, a first set of bond wires connected to the semiconductor chip for providing current flow into the semiconductor device, and a second set of bond wires that are in a current loop with the first set of bond wires and are connected to the semiconductor device for providing current flow out of the semiconductor device, wherein the first and second set of bond wires are configured in an inter-digitated pattern to increase the magnitude of mutual inductive coupling between the first and second set of bond wires.

In accordance with a specific embodiment of the present invention, the semiconductor device comprises a power field effect transistor and the substrate, comprises a lead frame, such as a Quad Flat No-Lead (QFN) lead frame.

In accordance with one aspect of the present invention, the first and second set of bond wires are configured such that "n" multiple first bond wires are inter-digitated with "n" multiple second bond wires.

In accordance with another aspect of the present invention, the first and second bond wires are coupled to the semiconductor device via bond pads distributed at multiple distances across the surface of the semiconductor device.

In accordance with another aspect of the present invention, the first and second set of bond wires are formed with a work loop to increase the stiffness of the bond wires.

In accordance with another aspect of the present invention, input and output regions of the substrate, are exposed on the bottom side of the package near the chip to further reduce parasitics.

In accordance with yet another aspect of the present invention, the upper edge of the semiconductor device is dedicated to bond pads associated with input/output functions, and at least the left and right (opposite) edges of the semiconductor device are dedicated to bond pads associated with high level input and output current.

In accordance with a still further aspect of this invention, an elongated semiconductor chip is provided, thereby reducing the length of the bond wires attached between the lead frame and bond pads placed in the interior surface of the chip.

In accordance with another embodiment, a multi-chip package increases mutual inductive coupling by closely spacing bond wires connecting the nFET to ground and bond wires connected to the pFET in an inter-digitated configuration. Since these wires carry current in opposite directions, negative mutual inductance is provided.

In accordance with a still further embodiment, two lead frames are provided, thereby reducing the length of the bond wires connected to the pFET. This still further embodiment provides additional cooling through the second lead frame.

BRIEF DESCRIPTION OF THE SEVERAL VIEWS OF THE DRAWINGS

The subject invention will hereinafter be described in conjunction with the appended drawing figures, which are provided for purposes of illustration and not limitation, wherein like numerals denote like elements, and.

DETAILED DESCRIPTION OF EXEMPLARY EMBODIMENTS

Systems and methods in accordance with the present invention overcome the prior art by providing a semiconductor device package with inter-digitated input and output bond wires configured to increase the negative mutual inductive coupling between the wires, thus reducing the overall parasitic inductance of the device.

Figure 3A:
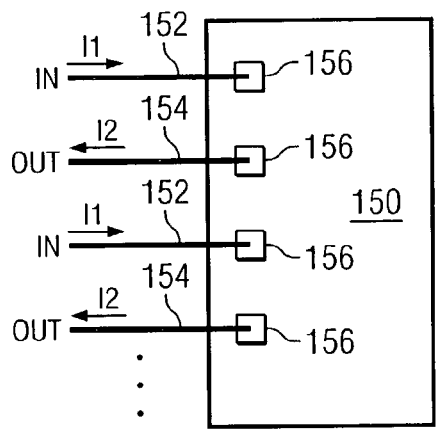
FIGS. 3A and 3B are schematic top views of inter-digitated bond wires in accordance with one aspect of the present invention.
Figure 3B:
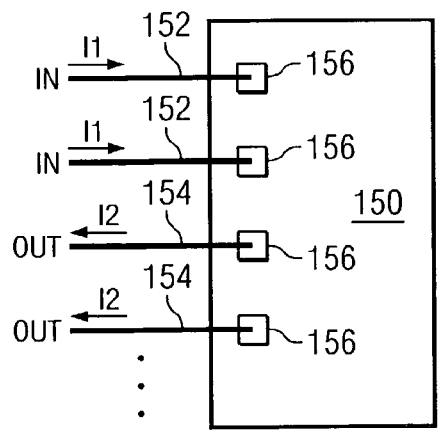

Referring now to FIG. 3A, a microelectronic component in accordance with the present invention generally includes a semiconductor chip 150 bonded to a lead frame (not shown), a first set of bond wires 152 connected to semiconductor chip 150 (e.g., via bond pads 156) for providing current flow into the semiconductor device, and a second set of bond wires 154 that are in a current loop with the first set of bond wires 152 and are connected to semiconductor device 150 for providing current flow out of the semiconductor device. As shown, bond wires 152 are inter-digitated with bond wires 154 in order to increase the magnitude of mutual inductive coupling between the two sets of wires. Alternatively, multiple wires from each of the first and second sets of bond wires may be inter-digitated as shown in FIG. 3B, where, for example, pairs of input wires 152 are inter-digitated with pairs of output wires 154. Although the bond wires 152 and 154 are shown on only one side of the chip 150, in FIGS. 3A and 3B such inter-digitating can also be done on two or more sides of the chip.

Figure 3C:
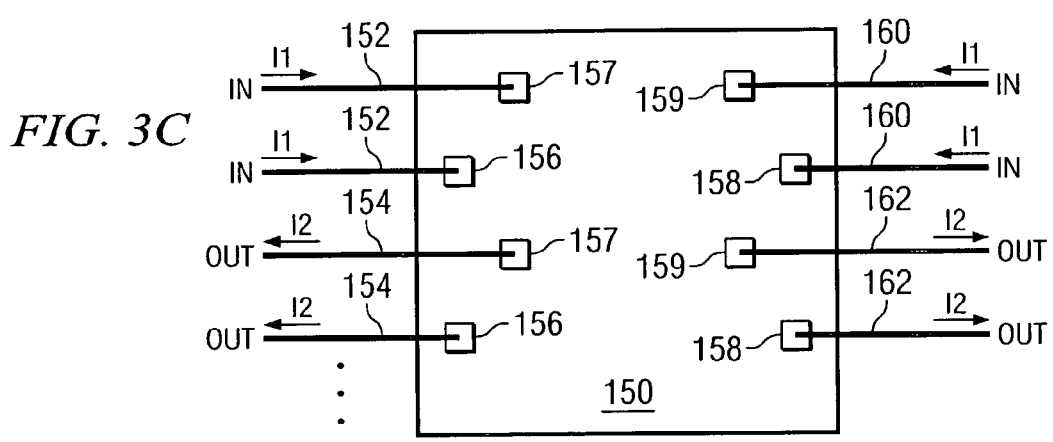
FIG. 3C is a schematic top view of inter-digitated bond wires in accordance with another aspect of the present invention.

A still further alternative is illustrated in FIG. 3C. Input wires 152 and output wires 154 are shown as in FIG. 3B. However, in this alternative contact pads are located not only on the periphery of the semiconductor chip 150, but also in the interior of the chip surface. Thus, on the left side of the chip, contacts 156 are at the periphery of the chip while contacts 157 are at the interior of the chip surface. In this configuration, the chip is accessed from both the left and right sides of the chip by way of peripheral pads and interior pads. On the right side of the chip, peripheral pads 158 and interior pads 159 are provided. Input wires 160 and output wires 162 are connected on the right side of the chip, as shown.

Figure 1:
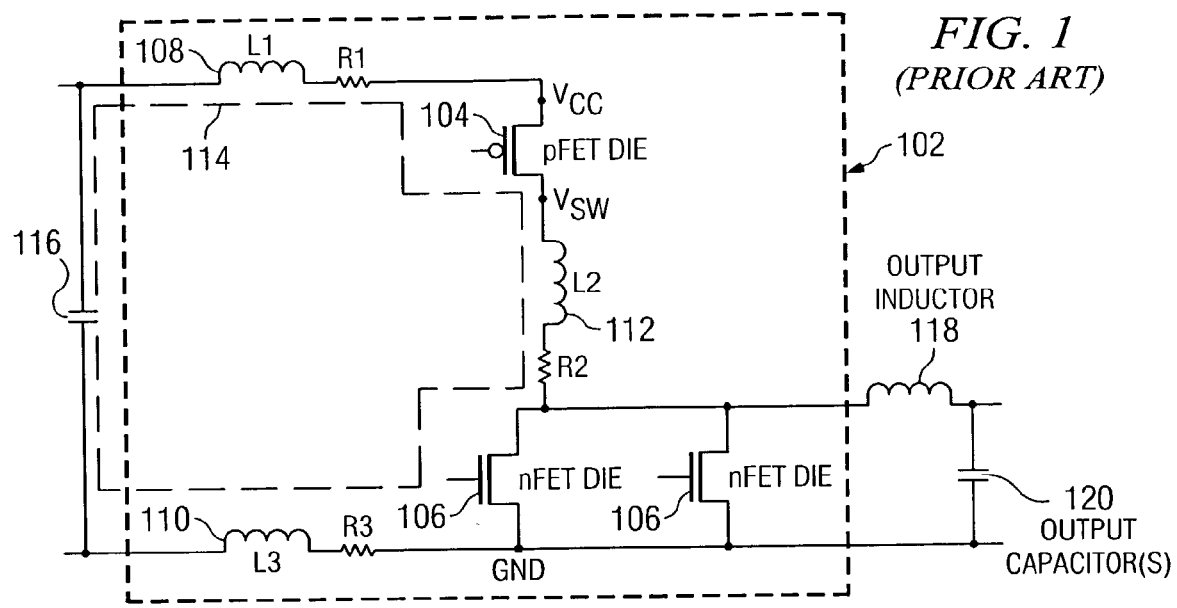
FIG. 1 is a schematic diagram of a typical DC voltage regulator integrated circuit.
Figure 2:
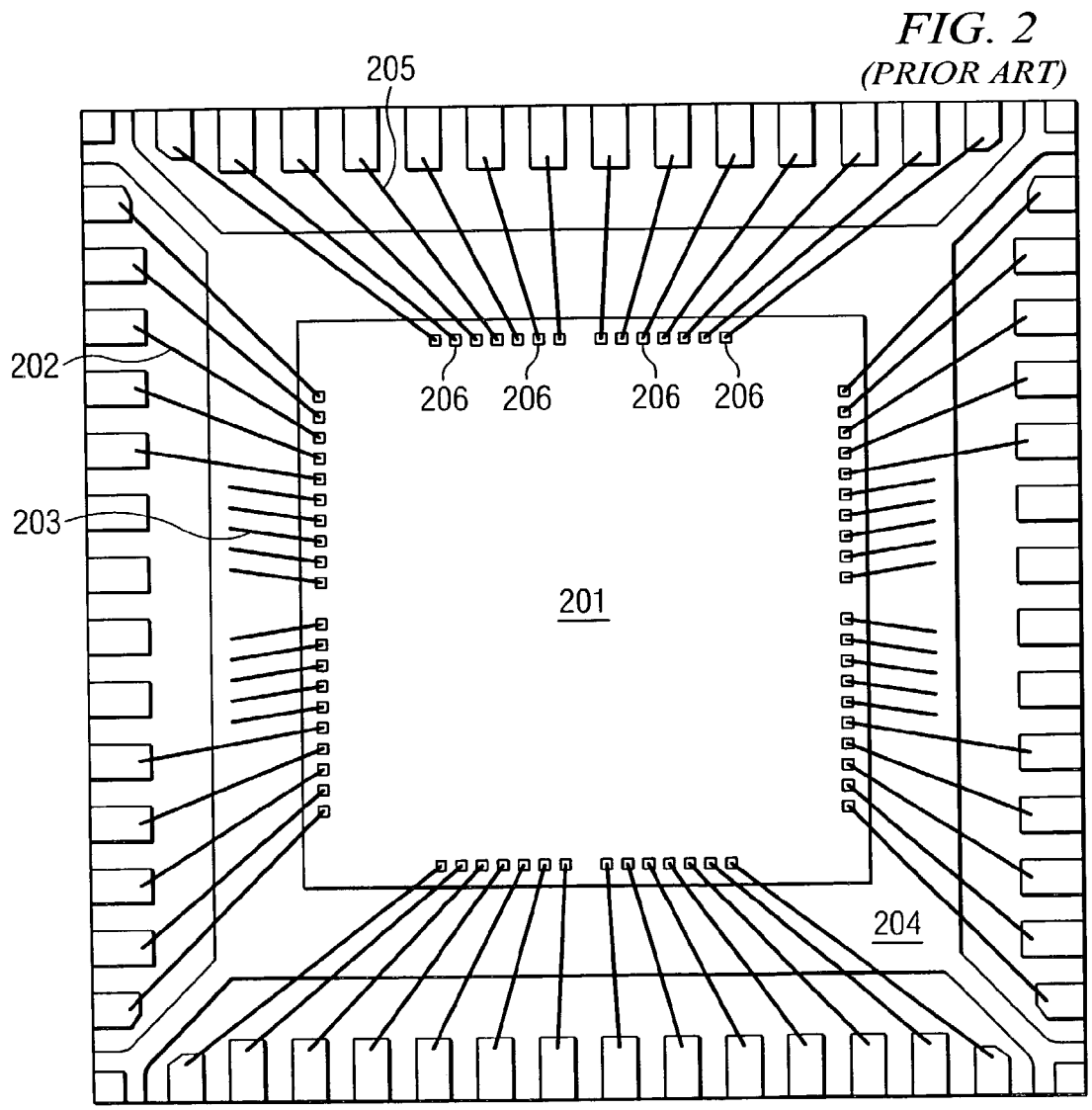
FIG. 2 is a top view schematic of a typical Quad Flat Non-leaded (QFN) lead frame package.
Figure 3D:
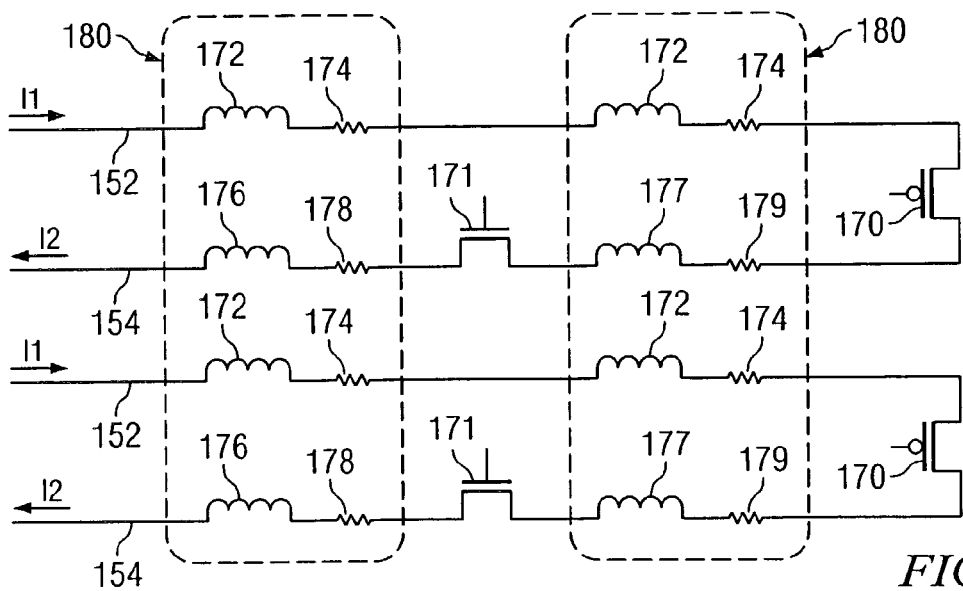
FIG. 3D is an exemplary schematic circuit illustrating the present invention.

With continued reference to FIGS. 3A–3C, as well as FIG. 1, refer now to FIG. 3D. Input conductors 152 are connected to the drain of P-type FETs 170 (node voltage Vcc), while output conductors 154 are connected to the source of n-type FETs 171. Since the present invention is particularly advantageous in the packaging of a voltage regulator of the type shown in FIG. 1. it is noted that pFET 170 corresponds to pFET 104 in FIG. 1 and nFETs 171 correspond to nFETs 106 in FIG. 1. Each of the input conductors has a resistance 174 and an inductance 172. Each of the output conductors has a resistance 178 and an inductance 176. The connection between FETs 170 and 171 (node voltage Vsw) has an inductance 177 and a resistance 179 These elements correspond to FIG. 1 elements where the input conductor has an inductance 108 (L1) and a resistance R1, the conductor between FETs 104 and 106 has an inductance 112 (L2) and resistance R2, and the output conductor has an inductance 110 (L3) and a resistance R3. However, in accordance with the present invention, the input and output lines are placed adjacent to each other in the illustrated inter-digitated arrangement. Thus, input currents 11 traveling on the input conductors are flowing in a direction shown, opposite to the direction of current flow of the output currents 12. This coupling results in a Mutual Inductance M; which can substantially cancel out the parasitic inductances L1+L2+L3. The value of M increases as the proximity of the parallel conductors decreases and the length that the wires are actually inter-digitated increases (see areas 180 as shown in FIG. 3D). Accordingly, as described in the exemplary illustrations of FIGS. 3A to 3D, by inter-digitated is meant aligning conductors that carry currents in opposite directions adjacent or at least in close proximity to each other to maximize mutual inductive coupling, thereby minimizing total inductance. These and other embodiments of the present invention will be described in further detail below.

Figure 4:
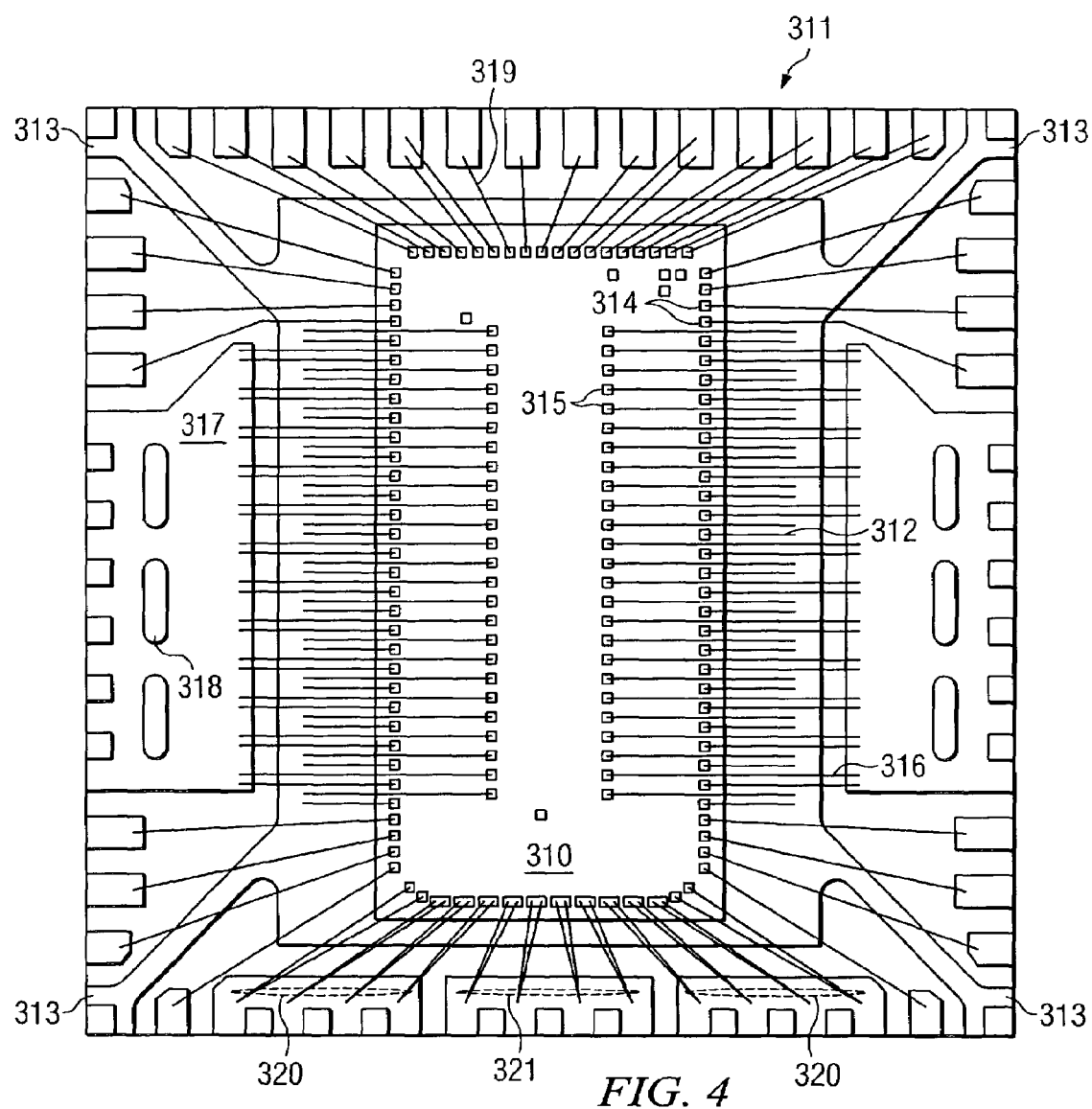
FIG. 4 is a top view schematic of an integrated FET chip mounted to a QFN lead frame in accordance with one embodiment of the present invention.

Referring now to FIG. 4, a semiconductor chip 310 (e.g., an integrated field effect transistor, or "FET") is suitably bonded to a lead frame 311, for example, a Quad Flat Non-Leaded (QFN) lead frame. The incoming current (from Vcc) travels through bond wires 312 connected from a die paddle 313 to bond pads 314. Output current (from Vsw) travels from the Vsw bond pads 315 through Vsw bond wires 316 to a Vsw tie bar 317. Those skilled in the art are aware that lead frame 311 is one type of suitable substrate. Although this invention is described utilizing a lead frame, those skilled in the art will appreciate that other substrates such as laminates and ceramic substrates could also be used to implement the invention.

Semiconductor chip 310 may be fabricated using any suitable semiconductor material upon which or within which an integrated circuit having a plurality of active and or passive circuit elements may be formed. Suitable materials for chip 310 include, for example, group IV semiconductors (i.e., Si, Ge, and SiGe), group III-V semiconductors (i.e., GaAs, InAs, and AlGaAs), and other less-conventional materials, such as SiC, diamond, and sapphire. Chip 310 may comprise single crystal material, a silicon-on-insulator material (SOI), or one or more polycrystalline or amorphous epitaxial layers formed on a suitable base material. It will be appreciated that chip 310 will also include an integrated circuit having various circuit elements incorporated into the semiconductor material as well as interconnect structures consisting of conductive paths and various electrics for isolating these conductive paths. Such electronic components and processing methods are well known and therefore will not be discussed in detail herein.

Furthermore, while the illustrated embodiment is discussed in the context of an integrated field effect transistor (FET), it will be appreciated that the present invention is not limited to a particular class of circuit elements. That is, chip 310 (and/or any additional semiconductor devices included on the lead frame) may include any combination of digital and/or analog circuit elements forming integrated circuits such as, for example, microprocessors, microcontrollers, application specific integrated circuits (ASICs) static or dynamic memory devices, integrated optic devices, integrated sensors, and field-effect transistor power semiconductors. The cross-referenced patent application to Triveda et al, discloses a voltage regulator module that can be packaged in accordance with the present invention.

With continued reference to FIG. 4, as described briefly above, mutual inductive coupling is created by inter-digitating pairs of Vcc bond wires 312 with pairs of Vsw bond wires 316. That is, pairs of Vcc and Vsw bond wires are alternated across all or a portion of the surface of chip 310. The array of bond pads 314 and 315 are preferably distributed across the FET region of chip 310 at multiple distances from the die edge to allow current to be delivered and removed from the chip with minimal lateral travel across the chip surface. This technique greatly reduces parasitics normally observed in microelectronic components with wire bonds distributed exclusively along the periphery of the chip.

Although the illustrated embodiment discloses inter-digitating bond wires in pairs, it will be appreciated that single bond wires may be inter-digitated. Furthermore, the bond wires may be configured such that more than two bond wires from each set are inter-digitated along all or a portion of the chip surface.

The bond wires may be formed using a variety of materials and any convenient bonding techniques, e.g., thermalsonic or thermo-compression bonding. Suitable bond wire materials include, for example, gold, gold-beryllium, aluminum, and aluminum alloys (e.g., Al—Mg—Si, Al—Si, Al—Mg, Al—Cu). Wire bonding machines that perform such manufacturing operations are well known in the art.

The diameter of the wires may range from about 15 microns to about 75 microns, depending upon, among other things, the required current-handling capability per wire to carry the total current drawn by the chip, in parallel. The number of wires and the pitch of the wires may be selected in accordance with applicable design goals. In one embodiment, for example, the pitch of the wires ranges from 50–100 microns, preferably about 80 microns. Additional information regarding bond wires, wire-bonding, and a number of other basic packaging techniques may be found in a number of standard texts, e.g., Seraphim, Lasky, and Li, PRINCIPLES OF ELECTRONIC PACKAGING (1989).

Both Vcc die paddle 313 and Vsw tie bar 317 may be exposed on the bottom side of the package, providing a short loop and a large electrical contact region to connect to the top layer metal of a printed wiring board (PWB) or the like, further reducing RLC parasitics. Electrical connection from the top layer of the PWB may be achieved, for example, using electrically conductive vias to lower metal planes. Furthermore, interlock holes, such as interlock hole 318 in FIG. 4, may be incorporated into the lead frame to provide improved mechanical stability to Vsw tie bar 317 for improved moisture resistance.

In the illustrated embodiment, digital I/O signals are brought out through bond wires 319 on the upper side of chip 310 and ground and gate signals are brought out through bond wires 320 and 321 on the lower side of the chip. This placement of bond pads allows for a highly efficient system design with low package and PWB parasitics. (The actual integrated circuits and power devices are not shown as the formation of devices into a semiconductor body is well known to those skilled in the art.) At the PWB level, digital circuitry remains isolated to the upper side of the package where signal routing to a digital controller is located, while high current regions of Vcc and Vsw reside on at least two other sides and underneath the package.

With continued reference to FIG. 4, note the aspect ratio of chip 310, diced in the shape of an elongated rectangle. In the context of the present invention, a power FET chip formed in an elongated rectangular shape and having the high current conducting bond wires 312 and 316 connected along the long edges (left and right sides of chip 310) provides shortened bond wires. In particular, note bond wires connected to pads 315 located on the central surface of chip 310, away from the periphery of the chip. These shortened bond wires provide current conduction to and from the chip with minimal travel distances through the conductors on and in the chip, as well. It is desirable to reduce such travel distances as well as the length of the bond wires to minimize both the total inductances and total resistances. In accordance with this invention, such shortened bond wires are also inter-digitated.

Figure 5:
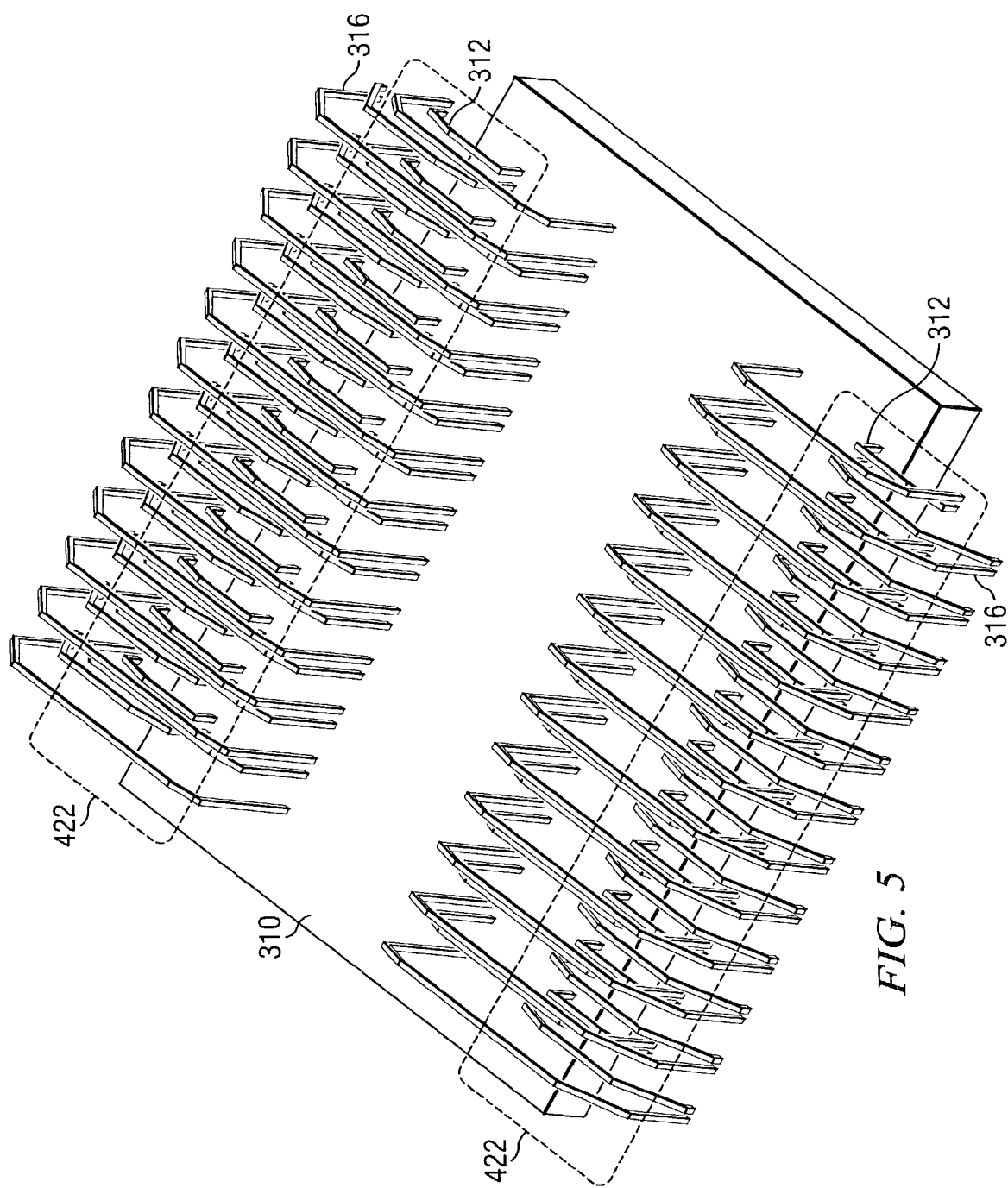
FIG. 5 is an isometric overview of an inter-digitated wire bond scheme in accordance with one embodiment of the present invention.

FIG. 5 shows a three dimensional isometric overview of the Vcc (312) and Vsw (316) inter-digitated bond wire region 422. As shown, the Vcc and Vsw wires are alternated in pairs to increase the negative mutual inductive coupling between the wires. As mentioned previously, the increase in negative mutual coupling decreases the equivalent inductance of the bond wires, improving device performance. This mutual coupling is a function of, among other things, the spacing of the wires and how long the wires run parallel to each other.

It will be apparent that, by bonding into the inner region of chip 310, longer wire lengths are necessary as compared to bonding only along the peripheral region of the chip. To reduce this tendency, the aspect ratio of the chip 310 may be increased, as just described with reference to FIG. 4 in order to shorten the overall wire lengths of the Vcc 312 and Vsw 316 bond wires.

Figure 6A:
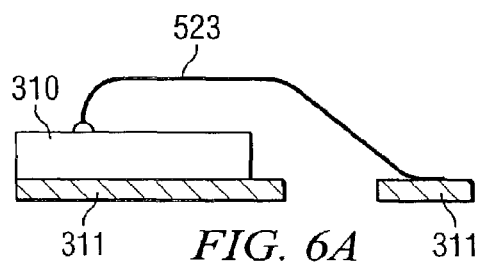
FIGS. 6A and 6B show, respectively, side-view schematics of wire bonds without and with a work loop.
Figure 6B:
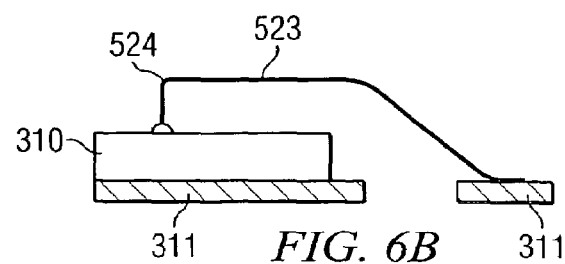

Refer now to FIG. 6A, which shows semiconductor chip 310 mounted on lead frame 311. The bond wire 523 is a conventional bond wire connected in a manner well know in the art. In practice it is known that many such bond wires are arranged adjacent to each other in a microelectronic component. Refer now to FIG. 6B, where corresponding elements have been identified with corresponding reference numerals. In order to reduce the risk of electrical shorting between adjacent wires 523 that can occur during the molding operation due to, for example, wire sweep, a work loop 524 may be created in the wire 523 to increase the overall stiffness of the loop region as shown in FIG. 6B. This increased stiffness reduces the likelihood of shorting between adjacent wires.

Figure 7:
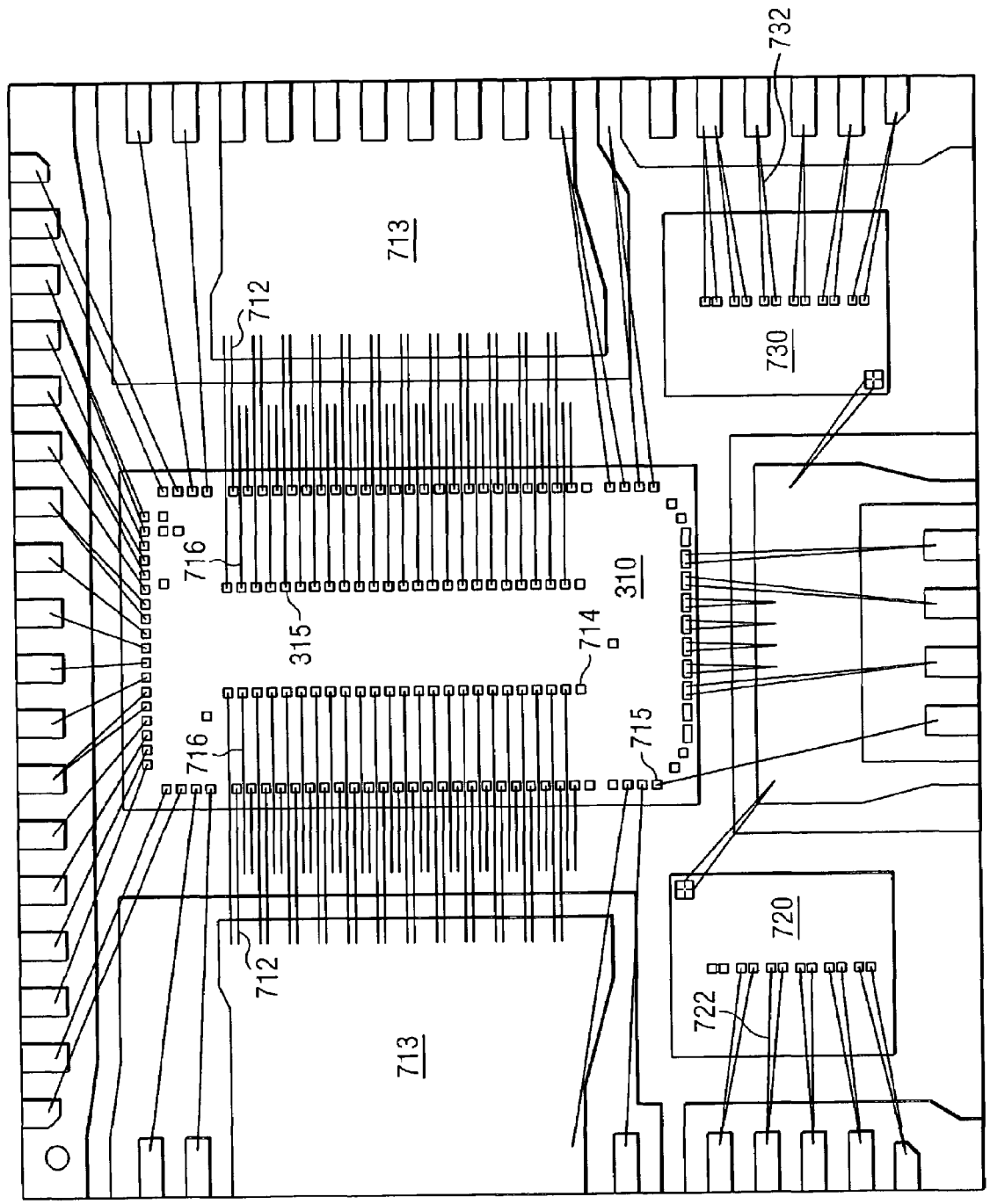
FIG. 7 is a top view schematic of a multi-chip package in accordance with another embodiment of the invention.

What has then been described are microelectronic components that house a single microelectronic device, i.e. a single packaged semiconductor chip. Refer now to FIG. 7, which illustrates the layout of a multi-chip lead frame package with one pFET 310 (corresponding to device 104 in FIG. 1) and 2 nFET dice 720 and 730 (corresponding to devices 104 and 106 of FIG. 1) housed in a single package. The nFET dice 720 and 730 have vertical devices that allow electrical connections on both their bottom and top surfaces. This configuration includes the single chip 310 (which can also be a vertical device that allows connections on both the bottom and top surfaces) packaged as previously described with reference to FIG. 4. As described above, mutual inductive coupling is created by inter-digitating pairs of Vcc bond wires 712 with pairs of Vsw bond wires 716. That is, pairs of Vcc and Vsw bond wires are alternated across all or a portion of the surface of chip 310. The array of bond pads 714 and 715 are preferably distributed across the FET region of chip 310 at multiple distances from the die edge to allow current to be delivered and removed from the chip with minimal lateral travel across the chip surface. Vcc tie bar 713 forms a common electrical connection for all of Vcc bond wires 712 on each side of the chip 310. Similarly, Vsw bond wires 716 are connected to a Vsw paddle on each side of the chip 310. Those skilled in the art will recognize that the "paddles" and "tie-bars" are interchangeable.

The inter-digitated arrangement of bond wires 712 and 716 realizes the advantages previously described with respect to a single chip package. However, in the embodiment of FIG. 7, a portion of the parasitics on the Vsw leg that correspond to the inductance $L_2$ (112) and resistance R2 of the schematic shown in FIG. 1 and those on the ground leg that correspond to the inductance $L_3$ (110) and resistance R3 of FIG. 1, still remain unresolved. This is primarily dictated by the positioning of the nFET dice 720 and 730 with respect to the pFET die 310, on the lead frame paddle. The Vsw interconnection between the pFET chip 310 and the nFET chips 720 and 730 is achieved through bond wires 716 and the Vsw paddle. The input current to the chips 720 and 730 enters them through their bottom surface as they are made up of vertical devices. The output current from the chips 720 and 730 flows through the ground bond wires 722 and 732, respectively, to the ground leads of the lead frame package. In accordance with the present invention, in a multi-chip package, the net parasitic inductance of inductors 112 ($L_2$) and 110 ($L_3$) can also be negated by increasing the negative mutual inductance between them.

Figure 8:
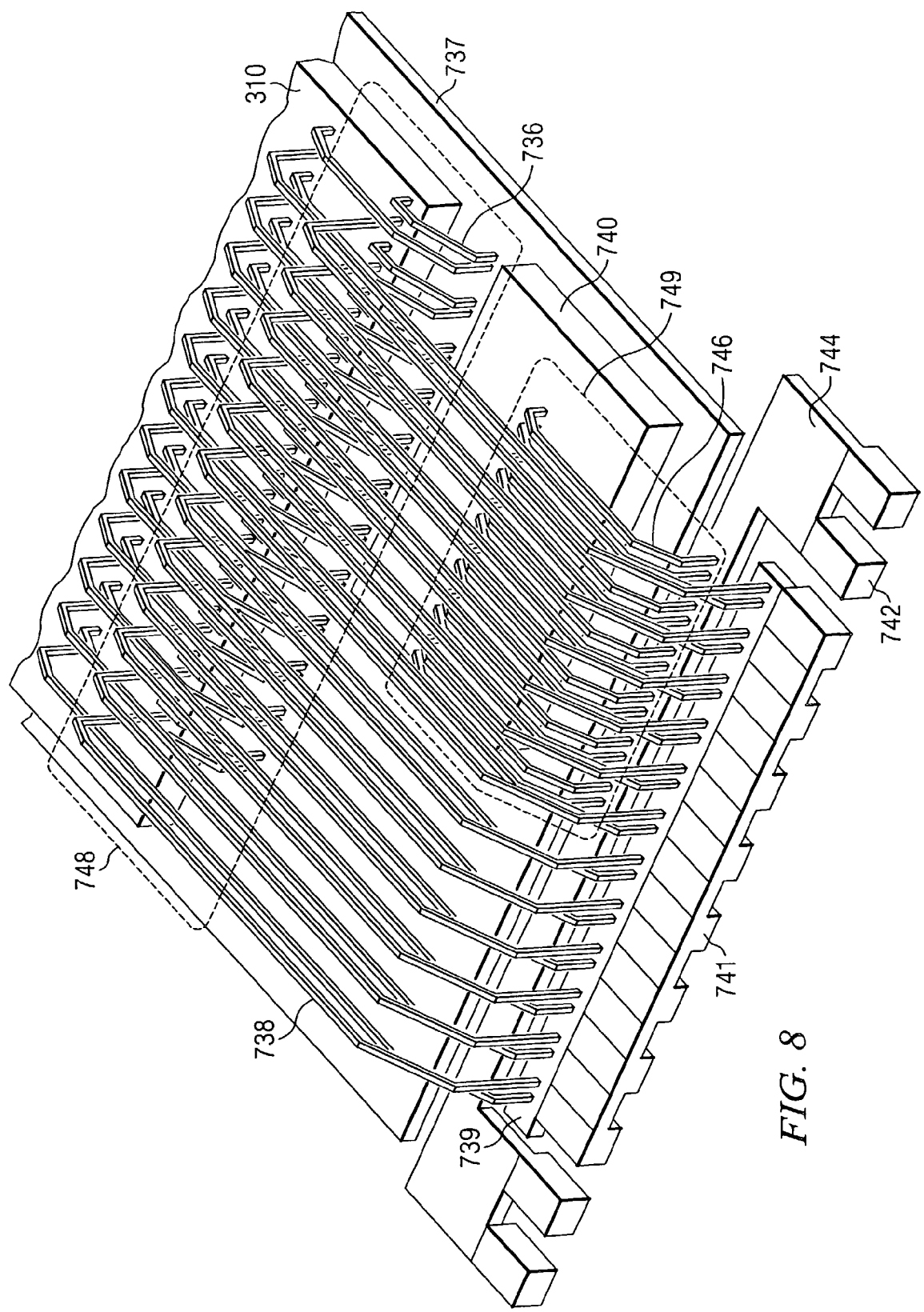
FIG. 8 is an isometric overview of a portion of a multi-chip package with a modified multi-chip lead frame.

Refer now to FIG. 8, which illustrates, in accordance with the present invention, the reduction of total inductance in a multi-chip package as the mutual inductance is maximized. For ease of illustration ½ of semiconductor chip 310 is shown attached to Vsw paddle 737. Vsw bond wires 736 are connected to Vsw paddle 737, as shown. Vcc bond wires 738 are connected to Vcc tie bar 739; which in turn is electrically connected to Vcc leads 741. The illustrated embodiment maximizes the mutual inductive coupling between the in-coming and out-going current carrying bond wires of a current loop in a multi-chip package. The second die, (an nFET semiconductor chip 740 in the present example) is also attached to paddle 737. Semiconductor chip 740 is positioned under the bond wires 738, which carry the in-coming current. Chip 740 is electrically connected to ground leads 742 and ground paddle 744 by bond wires 746. The current in bond wires 738 travels from left to right while the current in bond wires 736 and 746 travels in the opposite direction, from right to left. This provides areas 748 and 749 where mutual inductive coupling provides negative inductance to counteract the parasitic inductance inherently present in the bond wires. Those skilled in the art will recognized that the illustrated paddle 737 can be electrically connected to Vsw, Vcc, ground, or any other potential, depending on the desired application. In all alternatives, the paddle conducts heat away from the chip or chips that are mounted on it.

Figure 9:
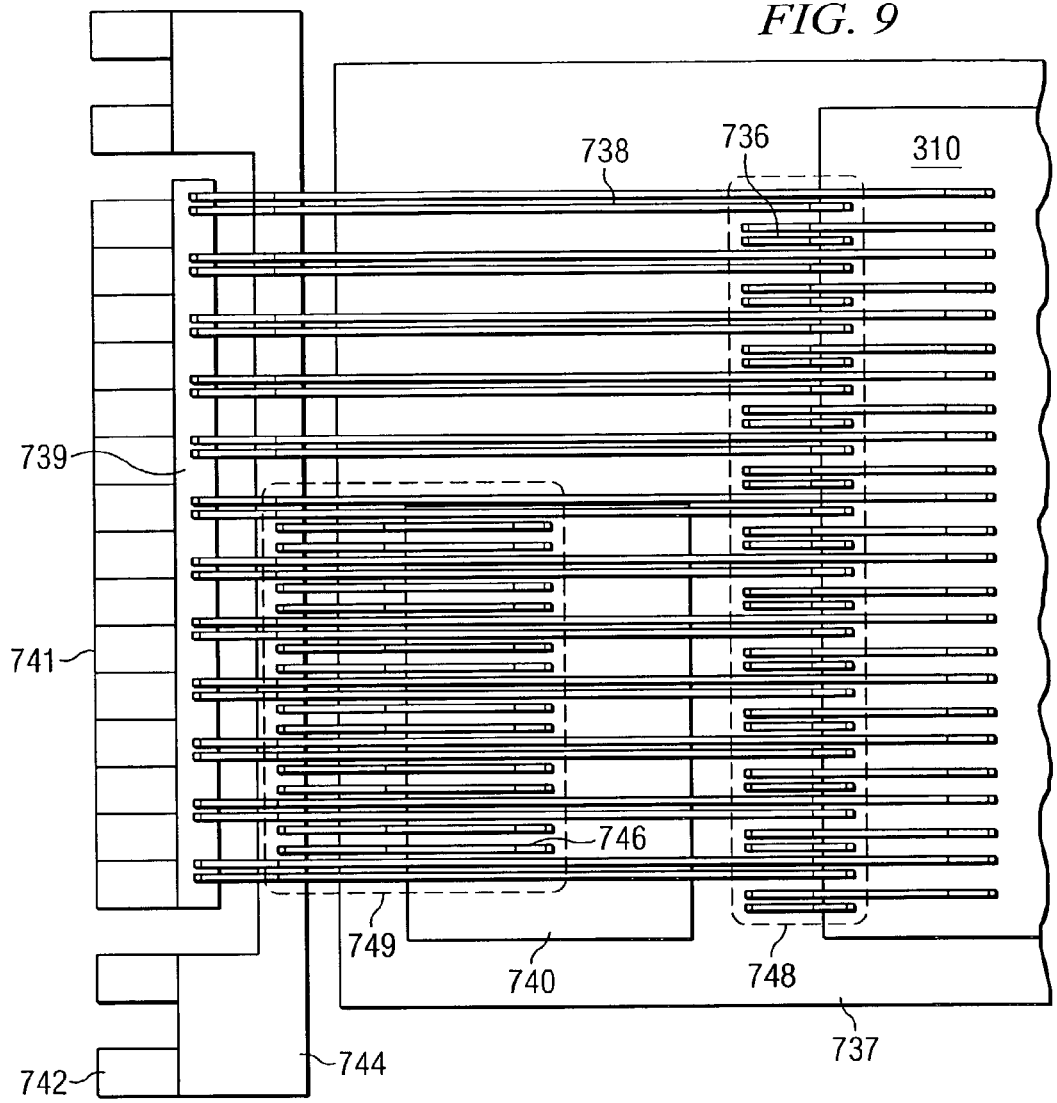
FIG. 9 is a top view of a portion of the multi-chip package.
Figure 10:
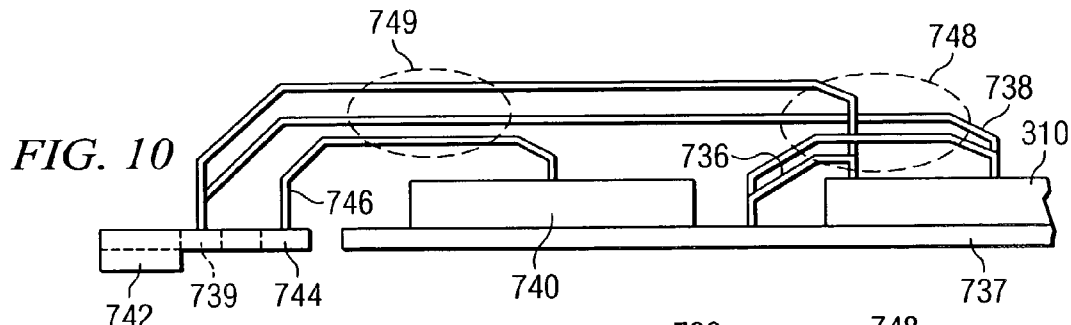
FIG. 10 is a side view of the embodiment shown in FIG. 9.

A partial top view of the FIG. 8 embodiment is shown in FIG. 9 with corresponding elements labeled with corresponding reference numerals. Similarly, FIG. 10 is a partial side view of the FIG. 8 embodiment with corresponding elements labeled with corresponding reference numerals. Note that in this embodiment the Vcc bond wires 738 are quite long. This can be a potential problem before or during the epoxy molding of the package. Due to the length of these bond wires 738, they might sag and therefore touch and cause a short circuit with Vsw bond wires 736 or ground bond wires 746. These limitations in terms of maximum bond wire lengths of bond wires 738 are eliminated in the embodiment illustrated in FIG. 11.

Figure 11:
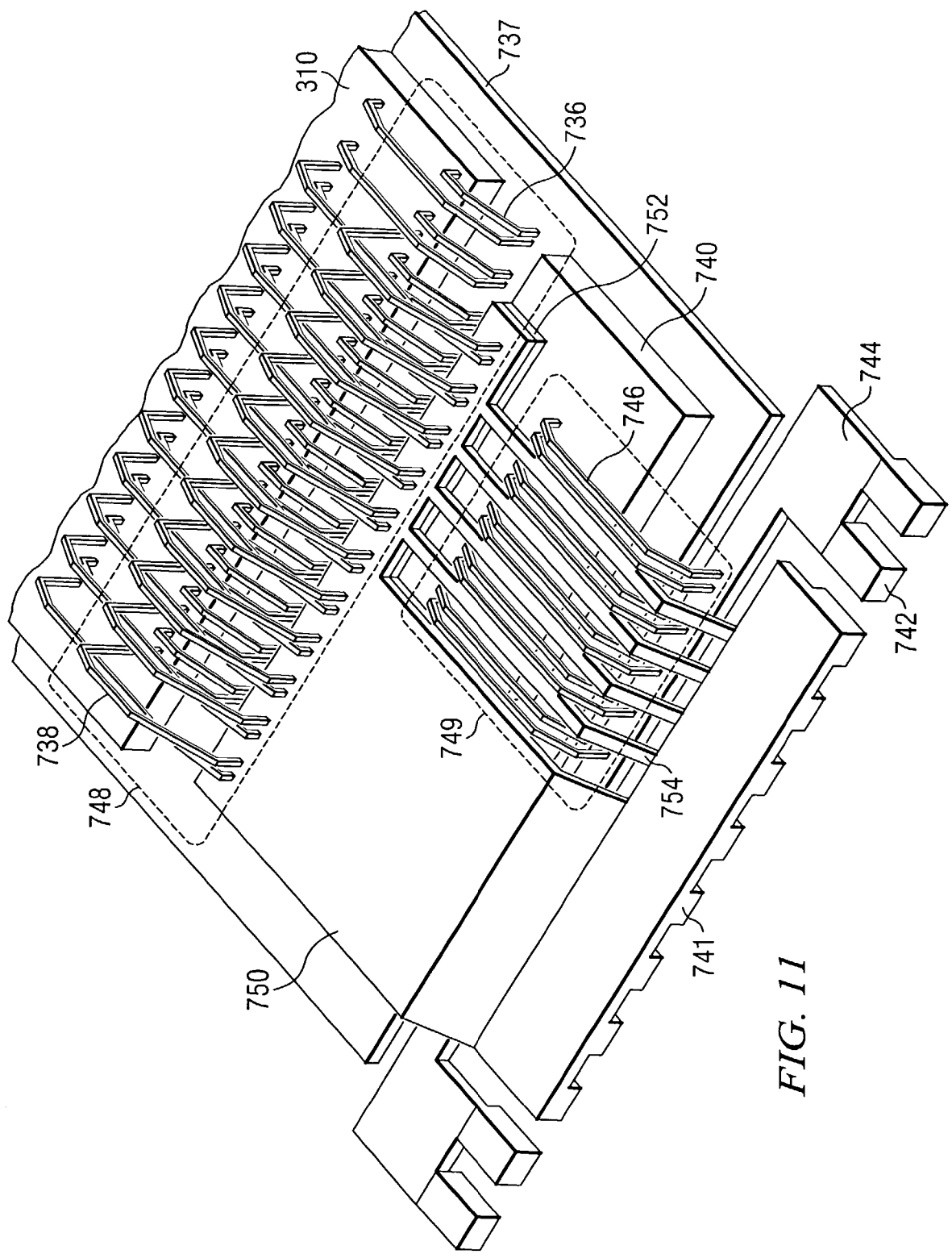
FIG. 11 is an isometric view of another embodiment of a portion of a multi-chip package utilizing a second lead frame.

Referring now to FIG. 11; which illustrates a multi-chip package including pFET semiconductor chip 310 and nFET semiconductor chip 740. These and other elements corresponding to FIG. 8 are numbered with corresponding reference numerals. Vsw bond wires are attached to Vsw paddle 737, as in FIG. 8. However, a substantial difference is the reduced length of Vcc bond wires 738; which are attached to a second lead frame including Vcc paddle 750. Although this invention is described in the context of a second lead frame, those skilled in the art will appreciate that a second substrate of other construction, for example: a laminate structure, a ceramic substrate, or other conductive member can also be used within the spirit and scope of this invention. This second lead frame is attached to the top surface of chip 740 by means of a well known die attach adhesive or thermal glue 752. This provides the stability required for this lead frame during the wire bonding process. This also provides an additional heat conduction path from the top surface of the chip 740, improving the overall thermal performance. In particular, as the area where adhesive 752 joins lead frame 750 to chip 740, substantial heat is transferred. This second heat conduction away from chip 740 can be further enhanced by enlarging the solid portion (portion without cut-outs) of lead frame 750 to cover an area that is not over chip 740 where no cut-outs are required. Note that in the area over chip 740, cut-outs 754 are provided in lead frame 750. The ground bond wires 746 are attached to the ground paddle 744 and run between cut-outs 754 in lead frame 750 to chip 740. This provides area 749 of closely spaced parallel conductors for mutual inductive coupling. Similarly area 748 provides mutual inductive coupling.

Figure 12:
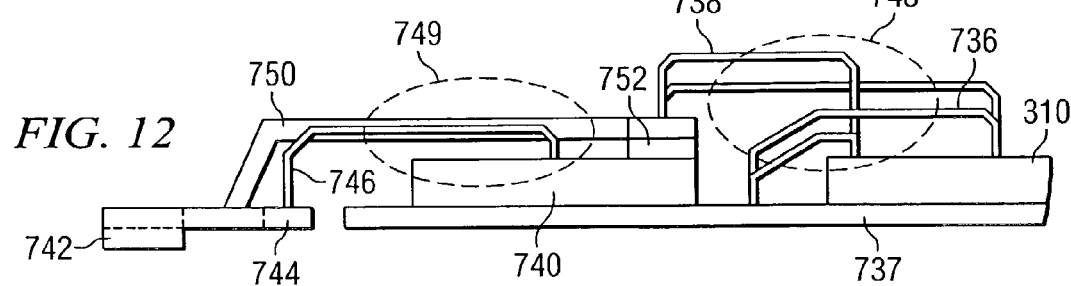
FIG. 12 is a side view of the embodiment shown in FIG. 11.

Refer now to FIG. 12; which is a side view of FIG. 11, with corresponding elements again labeled with corresponding reference numerals. Note again the shortened bond wires 738. FIG. 12 also further illustrates the areas of mutual inductive coupling at 748 and 749. In particular, FIG. 12 further illustrates the inter-digitated conductors in area 749. Also illustrated is the thermal glue 752. If the dimensions of chips 310 and 740 were different, there could be empty space under lead frame 750; which would not be supported by chip 740. This would create an imbalance in the stability during the wire bonding process onto lead frame 750. To compensate for this, dummy spacers such as Ceramic Alumina (not shown) of the same thickness as chip 740 could be used in those empty spaces. Such dummy spacer material should be any substance with a coefficient of thermal expansion close to that of chip 740 to avoid a difference in thermal stress at the different attach junctions of lead frame 750.

Although the invention has been described herein in conjunction with the appended drawings, those skilled in the art will appreciate that the scope of the invention is not so limited. Various modifications in the selection, design, and arrangement of the various portions of the microelectronic components and the method of fabrication discussed herein may be made without departing from the scope of the invention as set forth in the appended claims.

What is claimed is:

1. A microelectronic component with reduced parasitic inductance, said component comprising:
   a semiconductor device coupled to a substrate;
   a first set of bond wires spaced in parallel and connected to said semiconductor device for providing current flow into said semiconductor device;
   a second set of bond wires that are in a current loop and spaced in parallel with said first set of bond wires and are connected to said semiconductor device for providing current flow out of said semiconductor device;
   said first and second set of bond wires configured in an inter-digitated pattern to increase the magnitude of mutual inductive coupling between said first and second set of bond wires.

2. The component of claim 1, wherein said semiconductor device comprises a field effect transistor and said substrate comprises a Quad Flat No-Lead (QFN) lead frame.

3. The component of claim 1, wherein said first and second set of bond wires are configured such that n of said first set of bond wires are inter-digitated with n of said second set of bond wires, wherein n is greater than 1.

4. The component of claim 1, wherein said first and second bond wires are coupled to said semiconductor device via two rows of bond pads, the first row being arranged near one edge of said semiconductor device, the second row being arranged at a greater distance from the edge of said semiconductor device.

5. The component of claim 1, wherein said semiconductor device is a P type power field effect transistor.

6. The component of claim 1, wherein said first and second set of bond wires are formed with a work loop to increase the stiffness of said bond wires.

7. The component of claim 1, wherein at least two sides of said semiconductor device are dedicated to bond pads associated with said first and second set of bond wires.

8. A method of fabricating a semiconductor component with reduced parasitic inductance, said method including the steps of:
   bonding a semiconductor device to a substrate;
   forming a first set of bond wires spaced in parallel on said semiconductor device for providing current flow into said semiconductor device;

forming a second set of bond wires on said semiconductor device spaced in parallel to said first set of bond wires such that said first and second set of bond wires are configured in an inter-digitated pattern to increase the magnitude of mutual inductive coupling between said first and second set of bond wires, and wherein said second set of bond wires provide current flow out of said semiconductor device and are in a current loop with said first set of bond wires.

9. The method of claim 8, wherein said semiconductor device comprises a field effect transistor and said substrate comprises a Quad Flat No-Lead (QFN) lead frame.

10. The method of claim 8, wherein said first and second set of bond wires are formed such that n of said first set of bond wires are inter-digitated with n of said second set of bond wires, wherein n is greater than 1.

11. The method of claim 8, wherein said first and second bond wires are formed on said semiconductor device via bond pads distributed in two rows arranged at multiple distances from an edge of said semiconductor device.

12. The method of claim 8, wherein said semiconductor device is a P type power field effect transistor.

13. The method of claim 8, further including the step of forming a work loop in said first and second set of bond wires to increase the stiffness of said bond wires.

14. The component of claim 8, wherein at least two sides of said semiconductor device are dedicated to bond pads associated with said first and second set of bond wires.

* * * * *